United States Patent
Glenn et al.

(10) Patent No.: US 7,470,955 B2
(45) Date of Patent: Dec. 30, 2008

(54) TECHNIQUE FOR IMPROVING NEGATIVE POTENTIAL IMMUNITY OF AN INTEGRATED CIRCUIT

(75) Inventors: Jack L. Glenn, Kokomo, IN (US); Troy D. Clear, Kokomo, IN (US); Mark W. Gose, Kokomo, IN (US); Doublas B. Osborn, Kokomo, IN (US); Nicholas T. Campanile, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 350 days.

(21) Appl. No.: 11/107,084

(22) Filed: Apr. 15, 2005

(65) Prior Publication Data

US 2006/0231890 A1 Oct. 19, 2006

(51) Int. Cl.
*H01L 29/06* (2006.01)

(52) U.S. Cl. ............... 257/335; 257/338; 257/E29.027

(58) Field of Classification Search .................. None
See application file for complete search history.

(56) References Cited

U.S. PATENT DOCUMENTS

| | | | |
|---|---|---|---|
| 5,146,298 | A | 9/1992 | Eklund |
| 5,243,214 | A | 9/1993 | Sin et al. |
| 5,801,420 | A * | 9/1998 | Fujishima .................. 257/343 |
| 5,925,910 | A * | 7/1999 | Menegoli ................... 257/335 |
| 6,225,181 | B1 | 5/2001 | Gregory |
| 6,264,167 | B1 * | 7/2001 | Hamazawa ................. 251/288 |
| 6,815,794 | B2 * | 11/2004 | Shin et al. .................. 257/500 |
| 7,076,070 | B2 | 7/2006 | Pearce et al. |
| 7,208,985 | B2 | 4/2007 | Yamashita |
| 2001/0050412 | A1 * | 12/2001 | Patti ......................... 257/565 |
| 2003/0168698 | A1 | 9/2003 | Shin et al. |
| 2004/0004263 | A1 | 1/2004 | Rothleitner |
| 2005/0110111 | A1 | 5/2005 | Horn |

FOREIGN PATENT DOCUMENTS

| | | |
|---|---|---|
| DE | 199 28 762 | 11/2000 |
| EP | 1 508 918 | 2/2005 |

OTHER PUBLICATIONS

EP Search Report dated Apr. 9, 2008.
Laine, J.P., et al.: "Substrate current control in smart power IC's with a flexible protection structure"; Proceedings of the 2002 Bipolar/BICOMS Circuits and Technology Meeting. (BCTM). Minneapolis, MN, Sep. 29-Oct. 1, 2002, IEEE Bipolar/BICMOS Circuits and Technology Meeting, New York, NY: IEEE, US Sep. 29, 2002, pp. 36-40, XP010613106. ISBN: 0-7803-7561-0.

* cited by examiner

*Primary Examiner*—Evan Pert
*Assistant Examiner*—Ben P Sandvik
(74) *Attorney, Agent, or Firm*—Jimmy L. Funke

(57) ABSTRACT

An integrated circuit (IC) with negative potential protection includes at least one double-diffused metal-oxide semiconductor (DMOS) cell formed in a first-type epitaxial pocket, which is formed in a second-type substrate. The IC also includes a second-type+ isolation ring formed in the substrate to isolate the first-type epitaxial pocket and a first-type+ ring formed through the first-type epitaxial pocket between the second-type+ isolation ring and the DMOS cell.

17 Claims, 4 Drawing Sheets

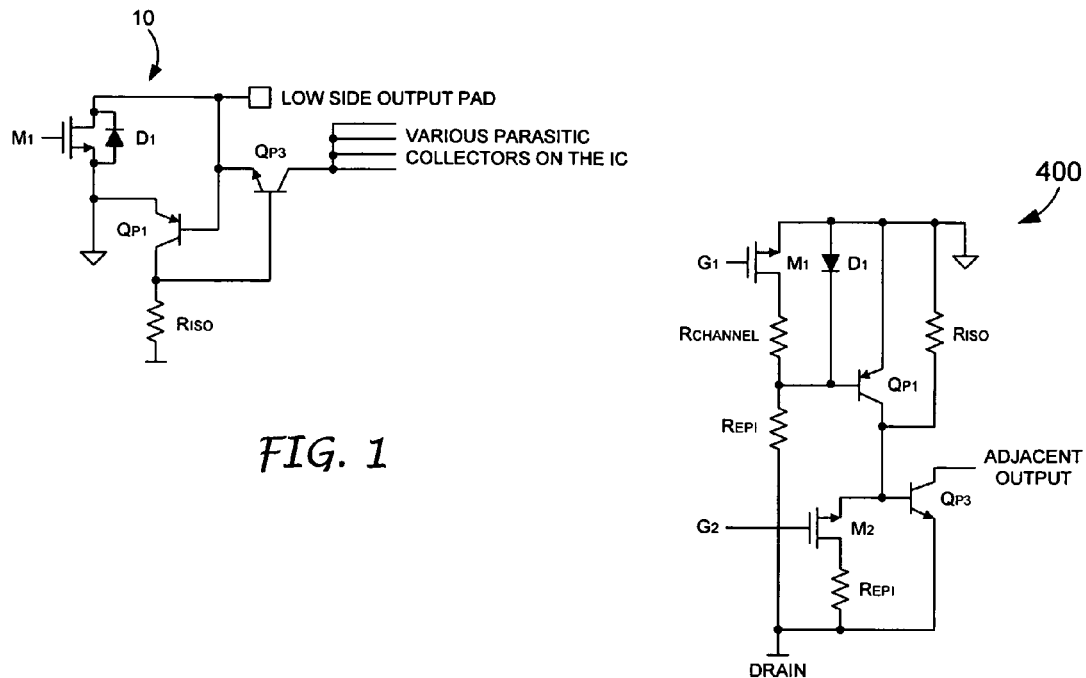
FIG. 1
FIG. 5
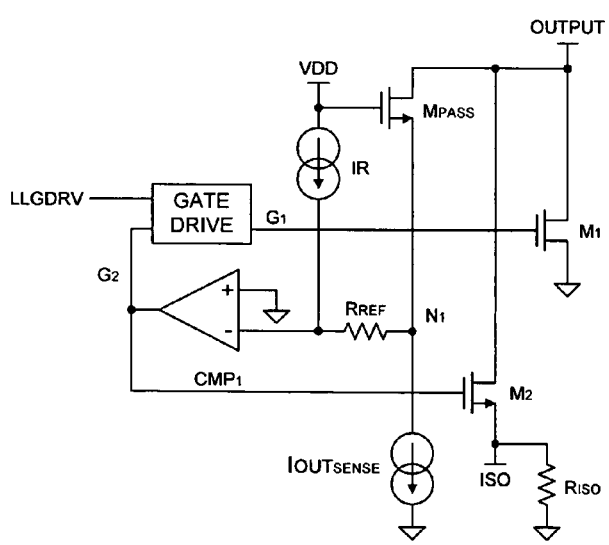
FIG. 4

TECHNIQUE FOR IMPROVING NEGATIVE POTENTIAL IMMUNITY OF AN INTEGRATED CIRCUIT

CROSS-REFERENCE TO RELATED APPLICATION

This application is related to U.S. patent application Ser. No. 11/261,310, entitled TECHNIQUE FOR IMPROVING NEGATIVE POTENTIAL IMMUNITY OF AN INTEGRATED CIRCUIT, by Mark W. Gose et al., filed Oct. 28, 2005.

TECHNICAL FIELD

The present invention is generally directed to a technique for improving negative potential immunity of an integrated circuit and, more specifically, to a technique for improving negative potential immunity of an integrated circuit that includes a plurality of drivers.

BACKGROUND OF THE INVENTION

A wide variety of drivers or switches, e.g., metal-oxide semiconductor field-effect transistors (MOSFETs), are utilized in motor vehicles to drive inductive loads, such as solenoids. In a typical application, a control signal, provided by a gate drive circuit, is applied across a gate and a source of a MOSFET to control energization of a solenoid that is coupled to a drain of the MOSFET. In modern motor vehicles, a motor vehicle chassis or frame has been electrically coupled to a negative or ground side of a battery. As such, most of the electrical loads within the vehicle have utilized the chassis as a current return path to the battery. Unfortunately, utilization of the chassis as a current return path, for multiple electrical loads, can result in potential differences along the chassis.

In most motor vehicles, one or more of the electrical loads in a motor vehicle may have one terminal tied to the battery and the other terminal tied to a drain of a MOSFET, e.g., an N-channel power double-diffused metal-oxide semiconductor (DMOS) driver, which is turned on in order to energize an associated load. As up-integration has become more prevalent, multiple of these power DMOS drivers have been integrated onto the same junction-isolated integrated circuit (IC) silicon die, along with associated gate drive circuitry, fault diagnostic circuitry and many other types of circuits, including digital logic.

A problem with this up-integrated approach occurs when an output terminal of one or more of the DMOS drivers is shorted to a negative potential, relative to the ground of the IC die (i.e., subjected to a short below ground (SBG)). This can occur, for example, due to the potential differences that exist along the chassis of the vehicle. Under this condition, circuits of the IC can malfunction with a variety of symptoms, such as adjacent drivers turning off when they should be on.

What is needed is a technique that reduces the likelihood of integrated circuit malfunction when an output terminal of a driver of an integrated circuit is taken to a negative potential.

SUMMARY OF THE INVENTION

One embodiment of the present invention is directed to an integrated circuit (IC) that includes negative potential protection. The IC includes at least one double-diffused metal-oxide semiconductor (DMOS) cell formed in a first-type epitaxial pocket, which is formed in a second-type substrate. The IC also includes a second-type+ isolation ring formed in the substrate to isolate the first-type epitaxial pocket and one of a first-type+ ring or an isolation trench formed through the first-type epitaxial pocket, between the second-type+ isolation ring and the DMOS cell.

According to another embodiment, an IC with negative potential protection includes at least one DMOS cell formed in an N-type epitaxial pocket, which is formed in a P-type substrate. The IC also includes a P-type+ isolation ring formed in the substrate to isolate the N-type epitaxial pocket and an N-type+ ring formed through the N-type epitaxial pocket between the P-type+ isolation ring and the DMOS cell. According to a different aspect of the present invention, the IC further includes a plurality of N-type+ regions formed in the substrate.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIG. 1 is an electrical schematic of a double-diffused metal-oxide semiconductor (DMOS) driver, including parasitic PNP and NPN transistors that are typically associated with the DMOS driver;

FIG. 4 is an electrical schematic of a circuit for pulling an isolation ring voltage toward a drain voltage of a DMOS driver to effectively shut-down a parasitic NPN transistor;

FIG. 5 is an electrical schematic depicting relevant portions of the circuit of FIG. 4 and including parasitic components usually associated with the DMOS driver of FIG. 4.

DESCRIPTION OF THE PREFERRED EMBODIMENTS

Figure 2:
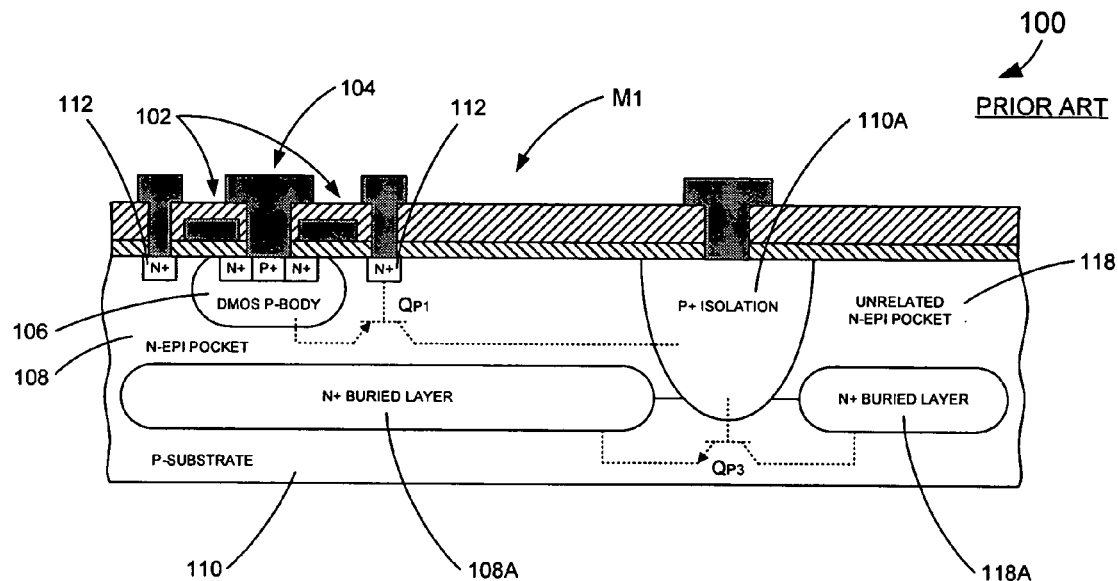
FIG. 2 is a cross-sectional view of a relevant portion of an integrated circuit (IC) including a conventional DMOS driver, constructed according to the prior art.

FIG. 1 depicts an exemplary electrical schematic 10 for a typical DMOS driver M1 (and its associated parasitic components). As is shown, the DMOS driver M1 has an associated parasitic PNP transistor QP1 and an associated parasitic NPN transistor QP3. With reference to FIG. 2, a relevant portion of integrated circuit (IC) 100 includes a DMOS driver M1 that has a source 104 and gate 102 formed within a DMOS P-type body 106 (collectively referred to herein as a DMOS cell). The P-type body 106 is formed in an N-type epitaxial pocket 108, which functions as a drain of the DMOS driver M1 and is coupled to metallization through N-type+regions 112.

When the drain of the driver M1 is taken to a sufficient negative voltage, e.g., −0.7 Volts, the junction between the pocket 108 (N-type+ buried layer 108A) and P-type substrate 110 (P-type+ isolation ring 110A) is forward biased. This forward biased junction acts as a base-emitter junction of the parasitic NPN transistor QP3. The collector of the parasitic NPN transistor QP3 can be any other N-type layer (e.g., N-type epitaxial pocket 118 and N-type+ buried layer 118A) within the IC 100. It should be appreciated that when current is pulled out of another epitaxial pocket (e.g., pocket 118), within the IC 100, malfunctions of the IC 100, such as adjacent output drivers turning off, may result.

According to one embodiment of the present invention, many of the problems caused by the parasitic PNP transistor QP1 can be mitigated by placing a relatively deep N-type+ ring between a body of the DMOS driver and an outer P-type+ isolation ring. With reference again to FIG. 2, a cross-sectional view of the IC 100 with the typical junction isolated DMOS driver M1 is illustrated, with respect to a surrounding isolation region. With no deep N-type+ ring, the parasitic PNP transistor QP1 has a high forward current gain, due to the lightly doped N-type epitaxial pocket 108 that exists between the body 106 and the isolation ring 110A.

Figure 3:
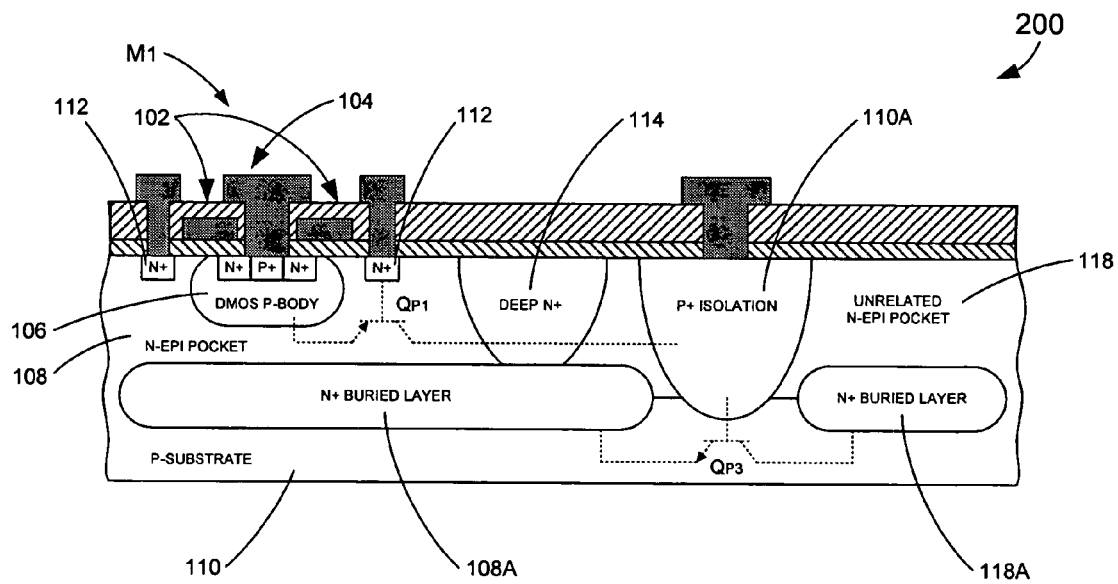
FIG. 3 is a cross-sectional view of a relevant portion of an IC including a DMOS driver, constructed according to one embodiment of the present invention, whose isolation ring is decoupled from a body of the DMOS driver.

With reference to FIG. 3, an integrated circuit 200 includes a deep N-type+ ring 114 formed between the P-type+ isolation ring 110A and the P-type body 106 of the DMOS driver M1. The ring 114 allows for reduction of the current gain of the parasitic PNP transistor QP1, as the minority carrier lifetime of holes injected into a base region of the parasitic PNP transistor QP1 is reduced. With the isolation ring 110A decoupled from the body 106 of the DMOS driver M1, a separate circuit can then be utilized to effectively pull the isolation ring 110A voltage toward the DMOS drain (i.e., pocket 108) voltage to effectively shut down the parasitic NPN transistor QP3. It should be appreciated that the IC 200 may include any desired number of oxide and metallization layers.

Figure 3A:
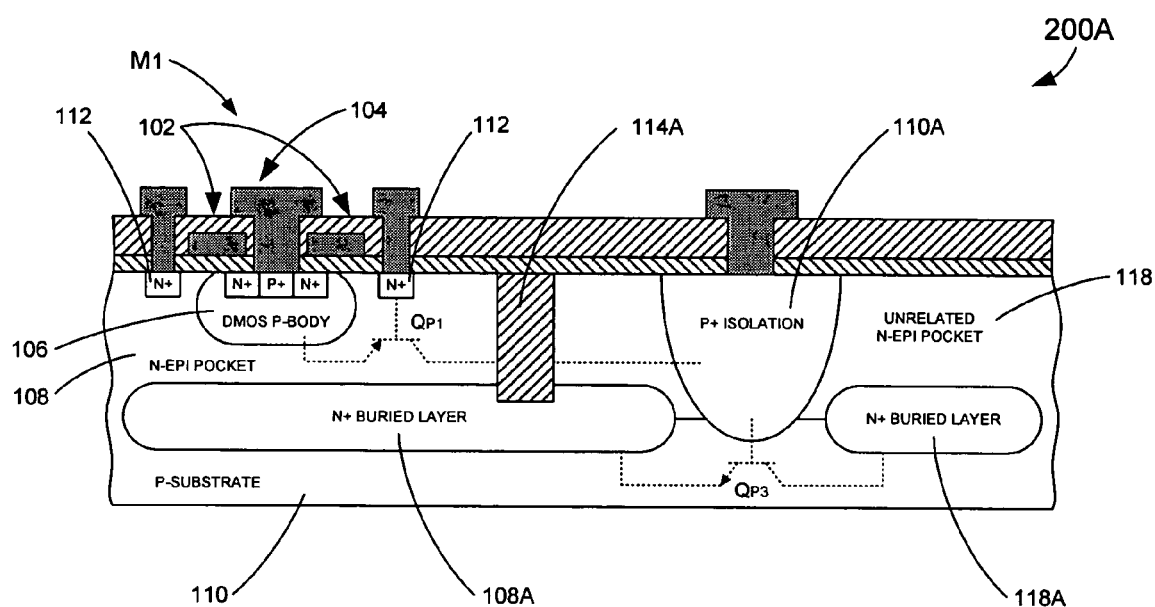
FIG. 3A is a cross-sectional view of a relevant portion of an IC including a DMOS driver, constructed according to another embodiment of the present invention, whose isolation ring is decoupled from a body of the DMOS driver.

FIG. 3A depicts an integrated circuit 200A that is similar to the integrated circuit 200 of FIG. 3, with the exception that the deep N-type+ ring 114 is replaced with a deep isolation trench 114A, which allows for reduction of the current gain of the parasitic PNP transistor QP1, as the minority carrier lifetime of holes injected into a base region of the parasitic PNP transistor QP1 is reduced. As with the circuit 200 of FIG. 3, with the isolation ring 110A decoupled from the body 106 of the DMOS driver M1, a separate circuit can then be utilized to effectively pull the isolation ring 110A voltage toward the DMOS drain (i.e., pocket 108) voltage to effectively shut down the parasitic NPN transistor QP3. The trench 114A may be, for example, filled with an oxide or include an oxide liner filled with polysilicon.

With reference to FIGS. 3-5, an integrated circuit 300 may be designed to include a transistor M2 incorporated within the same epitaxial pocket as the DMOS driver M1. In this configuration, the transistor M2 shares a common drain connection with the driver M1 and a source of the transistor M2 is tied to the isolation ring 110A or the P-type substrate 110. A comparator CMP1 is also incorporated within the IC 300 to sense when the drain of the DMOS driver M1 is going below the IC 300 ground by a voltage equal to the product of the value of the current IR and the value of the resistor Rref. A transistor Mpass is implemented to act as a pass device to transfer the drain voltage of the DMOS driver M1 to node N1, when the drain voltage of the DMOS driver M1 is relatively low, e.g., about 0.1 Volts.

As the drain voltage of the DMOS driver M1 goes sufficiently below ground, the comparator CMP1 goes high providing a gate signal G2 to a gate of the transistor M2. The gate signal G2 causes the transistor M2 to turn on causing the transistor M2 to pull the isolation ring 110A/P-type substrate 110 down locally around the DMOS driver M1 (to reduce the likelihood of forward biasing of the isolation ring 110A/N-type epitaxial pocket 108 junction). This may be facilitated by tying the isolation ring 110A/P-type substrate 110 to the IC 300 ground some distance away from the DMOS driver M1 so as to provide a resistive path (having a resistance Riso) that the transistor M2 can work against (see circuit 400 of FIG. 5). In this manner, independent below ground protection circuitry, as described above, may be utilized for each DMOS driver in order to prevent disruption of circuitry within the IC from a short below ground (SBG). Utilizing this technique, shorts to the vehicle chassis (which can result in negative voltages on the outputs of DMOS drivers) can be handled without disruption to other circuitry within the IC.

Figure 6:
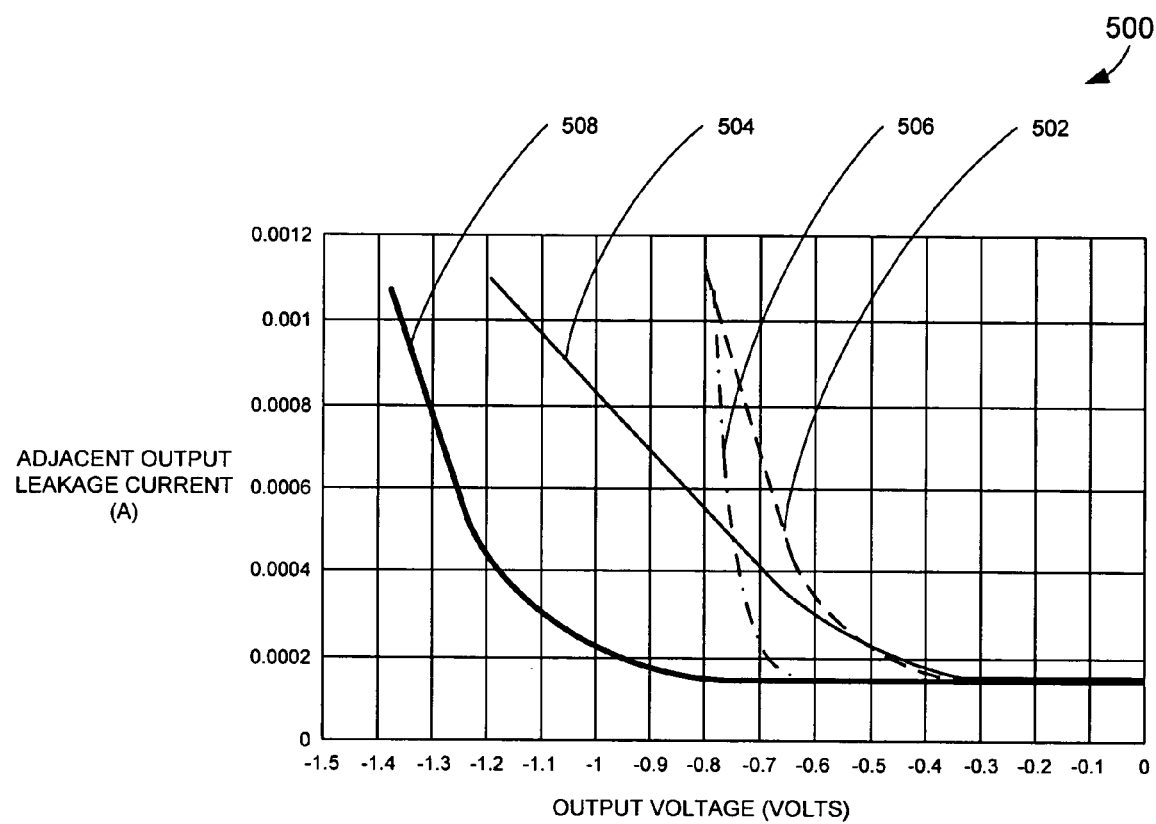
FIG. 6 is a graph with curves that illustrate the relationship between a negative voltage on a drain of a DMOS driver, constructed according to the present invention, and an output current leakage associated with an adjacent DMOS driver within the same IC.

The graph 500 of FIG. 6 includes curves 502, 504, 506 and 508, which demonstrate the performance gain obtained by pulling the isolation ring 110A/P-type substrate 110 of the IC 300 down locally around the DMOS driver M1. The curves 502 and 504 represent the current out of a first output pin of the IC 300, with an associated DMOS driver (e.g., driver M1) turned off and on, respectively. The curves 506 and 508 represent the parasitic current pulled into a second output pin (associated with another DMOS driver adjacent to the driver M1) with the DMOS driver associated with the first output pin turned off and on, respectively. The magnitude of this parasitic current represents the strength of the parasitic and the likelihood of disruption of the circuitry of the IC. As is depicted, with the driver M1 turned on, the current of the adjacent DMOS driver is measurably less for negative voltages less than about −0.7 Volts, as compared to when the driver M1 is turned off.

While the discussion herein is directed to an IC with N-type epitaxial pockets and a P-type substrate, it should be appreciated that the types of the epitaxial pockets and substrate may be reversed. In this case, the other regions, discussed above, would also be reversed in type. It should also be appreciated that the present invention is generally applicable to any DMOS device. That is, the present invention may be incorporated within a lateral DMOS device as depicted in FIGS. 3-3A, a lateral DMOS device with a filled oxide located between the body and drain, an up-drain DMOS device where the NBL region is the drain, a lateral DMOS device where the epitaxial layer is P-type and the DMOS device sits in a deep diffused N-type well, etc.

As used herein, the terms "first-type" and "second-type" refer to opposite types. For example, if the first-type is N-type then the second-type is P-type. As is well know to those of ordinary skill in the art, an N-type semiconductor material is a semiconductor material in which the predominant charge carriers are electrons and an P-type semiconductor material is a semiconductor material in which the predominant charge carriers are holes (positive charges). As used herein a + sign indicates very heavy doping approaching the solid solubility limit. For example, an N-type+ region is an N-type region where the doping approaches the solid solubility region.

Accordingly, techniques have been described herein that advantageously reduce the likelihood of integrated circuit (IC) malfunction when an output terminal of a driver of the IC is taken to a negative potential. This is particularly advantageous in the automotive industry, which increasingly utilizes ICs that include multiple drivers to switch various inductive loads.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An integrated circuit having negative potential protection, comprising:
a first double-diffused metal-oxide semiconductor (DMOS) cell formed in a first-type epitaxial pocket, wherein the first-type epitaxial pocket is formed in a second-type substrate;
a second-type+ isolation ring formed in the substrate to isolate the first-type epitaxial pocket;
one of a first-type+ ring or an isolation trench formed through the first-type epitaxial pocket between the second-type+ isolation ring and the first DMOS cell;
a second DMOS cell formed in the first-type epitaxial pocket, wherein the first and second DMOS cells have a common drain and a source of the second DMOS cell is coupled to one of the isolation ring and the substrate; and
a comparator including an output, a first input and a second input, wherein an output of the comparator is coupled to a gate of the second DMOS cell, and wherein the first input of the comparator receives a reference signal and the second input of the comparator is coupled to the common drain, where the comparator provides a turn-on signal to the gate of the second DMOS cell when a signal at the second input is below the reference signal, and where the turn-on signal causes the second DMOS cell to conduct shorting a base-emitter junction of a parasitic NPN transistor.

2. The integrated circuit of claim 1, wherein the first-type+ ring reduces a forward current gain of a parasitic PNP transistor.

3. The integrated circuit of claim 1, wherein the first-type+ ring is an N-type+ ring.

4. The integrated circuit of claim 3, wherein the first-type epitaxial pocket is an N-type epitaxial pocket.

5. The integrated circuit of claim 4, wherein the second-type substrate is a P-type substrate.

6. The integrated circuit of claim 5, wherein the second-type+ isolation ring is a P-type+ isolation ring.

7. The device of claim 1, further comprising:
a plurality of N-type+ regions formed in the substrate on either side of a P-type body of the DMOS cell.

8. The integrated circuit of claim 1, further comprising:
a pass transistor including a gate, a drain and a source, wherein the drain of the pass transistor is coupled to the common drain and the source of the pass transistor is coupled to the second input of the comparator, and wherein the gate of the pass transistor is controlled to couple the drain of the first DMOS cell to the second input of the comparator when a voltage at the drain of the first DMOS cell is below a predetermined level.

9. An integrated circuit having negative potential protection, comprising:
at least one double-diffused metal-oxide semiconductor (DMOS) cell formed in an N-type epitaxial pocket, wherein the N-type epitaxial pocket is formed in a P-type substrate;
a P-type+ isolation ring formed in the substrate to isolate the N-type epitaxial pocket;
an N-type+ ring formed through the N-type epitaxial pocket between the P-type+ isolation ring and the DMOS cell;
a second DMOS cell formed in the N-type epitaxial pocket, wherein the first and second DMOS cells have a common drain and a source of the second DMOS cell is coupled to one of the isolation ring and the substrate; and
a comparator including an output, a first input and a second input, wherein an output of the comparator is coupled to a gate of the second DMOS cell, and wherein the first input of the comparator receives a reference signal and the second input of the comparator is coupled to the common drain, where the comparator provides a turn-on signal to the gate of the second DMOS cell when a signal at the second input is below the reference signal, and where the turn-on signal causes the second DMOS cell to conduct shorting a base-emitter junction of a parasitic NPN transistor.

10. The integrated circuit of claim 9, wherein the N-type+ ring reduces a forward current gain of a parasitic PNP transistor.

11. The device of claim 9, further comprising:
a plurality of N-type+ regions formed in the substrate on either side of the P-type body of the DMOS cell.

12. The integrated circuit of claim 9, further comprising:
a pass transistor including a gate, a drain and a source, wherein the drain of the pass transistor is coupled to the common drain and the source of the pass transistor is coupled to the second input of the comparator, and wherein the gate of the pass transistor is controlled to couple the drain of the first DMOS cell to the second input of the comparator when a voltage at the drain of the first DMOS cell is below a predetermined level.

13. An integrated circuit having negative potential protection, comprising:
a first double-diffused metal-oxide semiconductor (DMOS) cell formed in a first-type epitaxial pocket, wherein the first-type epitaxial pocket is formed in a second-type substrate;
a second-type+ isolation ring formed in the substrate to isolate the first-type epitaxial pocket;
a second DMOS cell formed in the first-type epitaxial pocket, wherein the first and second DMOS cells have a common drain and a source of the second DMOS cell is coupled to one of the isolation ring and the substrate; and
a comparator including an output, a first input and a second input, wherein an output of the comparator is coupled to a gate of the second DMOS cell, and wherein the first input of the comparator receives a reference signal and the second input of the comparator is coupled to the common drain, where the comparator provides a turn-on signal to the gate of the second DMOS cell when a signal at the second input is below the reference signal, and where the turn-on signal causes the second DMOS cell to conduct shorting a base-emitter junction of a parasitic NPN transistor.

14. The integrated circuit of claim 13, further comprising:
a first-type+ ring formed through the first-type epitaxial pocket between the second-type+ isolation ring and the first DMOS cell.

15. The integrated circuit of claim 14, wherein the first-type+ ring reduces a forward current gain of a parasitic PNP transistor.

16. The device of claim 13, further comprising:
a plurality of N-type+ regions formed in the substrate on either side of the P-type body of the DMOS cell.

17. The integrated circuit of claim 13, further comprising:
a pass transistor including a gate, a drain and a source, wherein the drain of the pass transistor is coupled to the common drain and the source of the pass transistor is coupled to the second input of the comparator, and wherein the gate of the pass transistor is controlled to couple the drain of the first DMOS cell to the second input of the comparator when a voltage at the drain of the first DMOS cell is below a predetermined level.

* * * * *